(12) United States Patent
Higashi et al.

(10) Patent No.: US 12,727,524 B2
(45) Date of Patent: Sep. 1, 2026

(54) SEMICONDUCTOR APPARATUS AND SEMICONDUCTOR APPARATUS MANUFACTURING METHOD

(71) Applicant: FUJI ELECTRIC CO., LTD., Kawasaki (JP)

(72) Inventors: Nobuhiro Higashi, Kawasaki (JP); Daiki Yoshida, Kawasaki (JP); Yuma Murata, Kawasaki (JP); Naoyuki Kanai, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 744 days.

(21) Appl. No.: 17/875,851

(22) Filed: Jul. 28, 2022

(65) Prior Publication Data

US 2023/0069967 A1 Mar. 9, 2023

(30) Foreign Application Priority Data

Sep. 3, 2021 (JP) ................................. 2021-143905

(51) Int. Cl.
*H10W 76/15* (2026.01)
*H10W 70/40* (2026.01)
(Continued)

(52) U.S. Cl.
CPC ....... *H10W 90/701* (2026.01); *H10W 70/479* (2026.01); *H10W 70/658* (2026.01);
(Continued)

(58) Field of Classification Search
CPC ............... H01L 24/48; H01L 23/49811; H01L 23/49844; H01L 23/49861; H01L 24/32;
(Continued)

(56) References Cited

U.S. PATENT DOCUMENTS 6,373,140 B1 * 4/2002 Onodera ............. H01L 23/3107 257/730
6,411,359 B1 * 6/2002 Kobayashi .......... G02F 1/13452 349/149
(Continued)

FOREIGN PATENT DOCUMENTS

JP S62291126 A 12/1987
JP H01167042 U 11/1989
(Continued)

OTHER PUBLICATIONS

Japanese Office Action dated Apr. 22, 2025, in the counterpart Japanese Patent Application No. 2021-143905.

*Primary Examiner* — Dale E Page
*Assistant Examiner* — Cristian A Tivarus
(74) *Attorney, Agent, or Firm* — Rabin & Berdo, P.C.

(57) ABSTRACT

A semiconductor apparatus includes a semiconductor element, a control terminal electrically connected to a top electrode of the semiconductor element through a wiring member, and a case member in which at least a portion of the control terminal is embedded and which defines a space for housing the semiconductor element. The control terminal includes a pad to which the wiring member is connected. The case member includes a wiring member positioning part raised on the case member as a reference point for a positioning of the wiring member before a connection is made of the wiring member to the pad.

13 Claims, 9 Drawing Sheets

(51) Int. Cl.

| | |
|---|---|
| ***H10W 70/65*** | (2026.01) |
| ***H10W 72/30*** | (2026.01) |
| ***H10W 76/12*** | (2026.01) |
| ***H10W 90/00*** | (2026.01) |
| *H10W 40/22* | (2026.01) |
| *H10W 72/00* | (2026.01) |
| *H10W 72/50* | (2026.01) |
| *H10W 74/00* | (2026.01) |

(52) U.S. Cl.

CPC ...... *H10W 40/22* (2026.01); *H10W 72/07523* (2026.01); *H10W 72/585* (2026.01); *H10W 72/884* (2026.01); *H10W 74/00* (2026.01); *H10W 90/734* (2026.01); *H10W 90/736* (2026.01); *H10W 90/755* (2026.01)

(58) Field of Classification Search

CPC ....... H01L 24/73; H01L 24/85; H01L 23/367; H01L 2224/32225; H01L 2224/32245; H01L 2224/48177; H01L 2224/48998; H01L 2224/73265; H01L 2224/85127; H01L 2224/85132; H01L 2924/182; H10W 70/479; H10W 70/658; H10W 72/07521; H10W 72/585; H10W 72/884; H10W 74/00; H10W 72/30; H10W 76/12; H10W 76/15

See application file for complete search history.

(56) References Cited

U.S. PATENT DOCUMENTS

| | | | | |
|---|---|---|---|---|
| 8,497,572 | B2 * | 7/2013 | Fukutani | H01L 24/32 257/E23.079 |
| 9,406,620 | B2 * | 8/2016 | Yamanishi | H01L 23/544 |
| 9,960,103 | B2 * | 5/2018 | Hanada | H01L 23/49811 |
| 2005/0155432 | A1 * | 7/2005 | Katayama | G01L 19/0069 73/729.2 |
| 2008/0245549 | A1 * | 10/2008 | Kodani | H05K 3/4682 174/126.1 |
| 2011/0300662 | A1 * | 12/2011 | Watanabe | G03F 9/708 438/70 |
| 2020/0205292 | A1 | 6/2020 | Inoue | |
| 2020/0313400 | A1 * | 10/2020 | Kawanishi | H01S 5/0239 |
| 2020/0402880 | A1 | 12/2020 | Yamauchi et al. | |

FOREIGN PATENT DOCUMENTS

| | | | | |
|---|---|---|---|---|
| JP | 2002134552 | A | * | 5/2002 |
| JP | 2002299551 | A | | 10/2002 |
| JP | 2007242703 | A | * | 9/2007 |
| JP | 2015162649 | A | * | 9/2015 |
| JP | 2020098885 | A | | 6/2020 |
| JP | 2021002610 | A | | 1/2021 |
| WO | 2021117548 | A1 | | 6/2021 |

* cited by examiner 41c
6
41d
41b
19a
62
7
19b
W
19
41a
18a
41d
18c 18b
18
41d
41a
19
19b
W
2
41c
41d
41b
19a
62
7
X
Y
Z

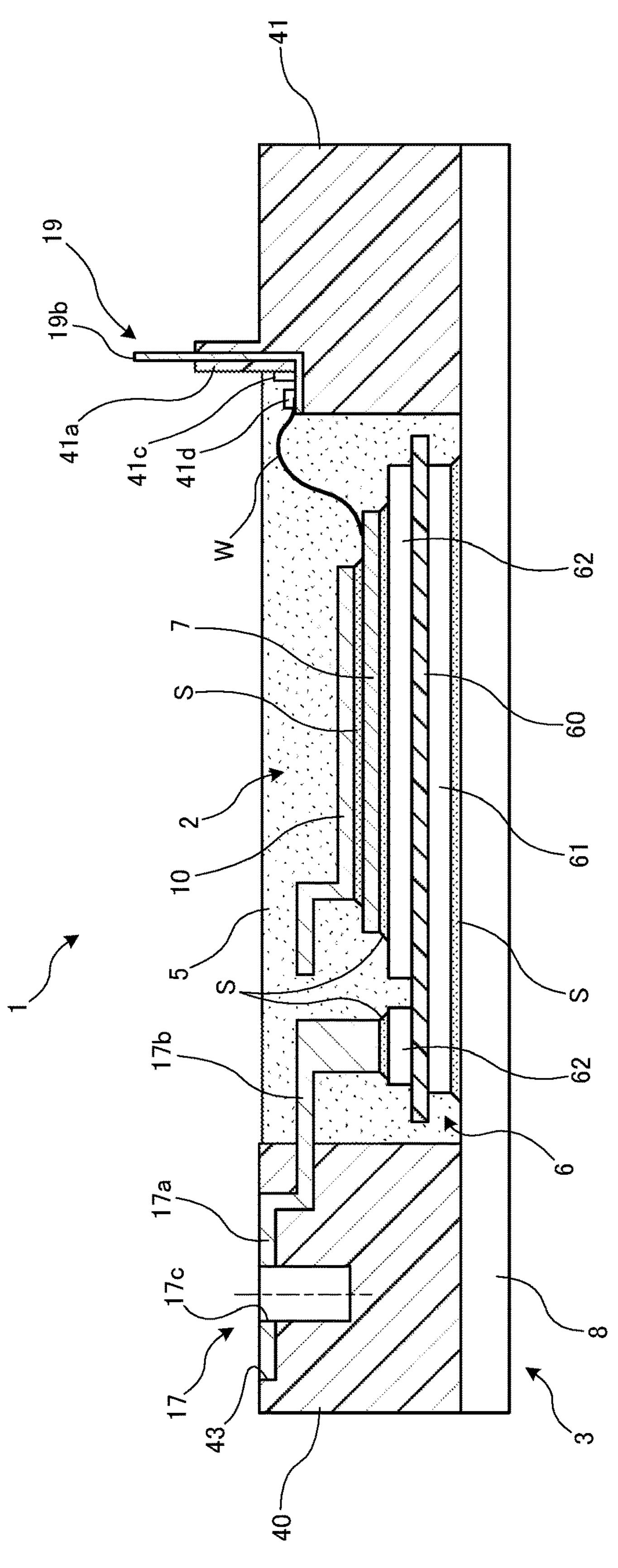
41
19
19b
41a
41c
41d
W
62
7
S
60
2
10
61
5
S
S
1
17b
62
6
17a
17c
17
43
8
3
40
FIG. 4
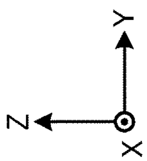
Y
Z
X

SEMICONDUCTOR APPARATUS AND SEMICONDUCTOR APPARATUS MANUFACTURING METHOD

CROSS REFERENCE TO RELATED APPLICATIONS

This application is based upon and claims the benefit of priority of the prior Japanese Patent Application No. 2021-143905, filed on Sep. 3, 2021, the entire contents of which are incorporated herein by reference.

BACKGROUND OF THE INVENTION

Field of the Invention

The present invention relates to a semiconductor apparatus and a semiconductor apparatus manufacturing method.

Description of the Related Art

A semiconductor apparatus has a substrate on which semiconductor elements such as an insulated gate bipolar transistor (IGBT), a power metal oxide semiconductor field effect transistor (power MOSFET), and a free wheeling diode (FWD) are provided, and is used in an inverter apparatus, for example.

With regard to this type of semiconductor apparatus, a multilayer substrate is disposed on the top face of a heat sink, and semiconductor elements are disposed via solder onto a circuit pattern on the multilayer substrate. Wire bonding is widely adopted as the method of making electrical connections in such a semiconductor apparatus. With wire bonding, locations to be connected (for example, a semiconductor element and an electrode element) are detected to recognize the correct bonding location (for example, see Japanese Patent Laid-Open Nos. 2002-134552 and 2002-299551).

SUMMARY OF THE INVENTION

In a typical wire bonding apparatus, to detect a bonding location automatically, image recognition technology, for example, is used to recognize a reference point. In this case, if error occurs in the recognition of the reference point, the positional precision of the bonding may be affected. If positional error occurs in wire bonding, the wire connection strength may be reduced, and the wires may be separated more easily.

The present invention has been devised in light of this point, and one objective thereof is to provide a semiconductor apparatus and a semiconductor apparatus manufacturing method that can improve the positional precision of wire bonding.

A semiconductor apparatus according to an aspect of the present invention is provided with a semiconductor element, a control terminal electrically connected to a top electrode of the semiconductor element through a wiring member, and a case member which is monolithically molded with the control terminal and which defines a space for housing the semiconductor element, wherein the control terminal includes a pad that acts as a connection point of the wiring member, and the case member includes a raised positioning part that acts as a reference point for positioning the wiring member with respect to the pad.

Also, a semiconductor apparatus manufacturing method according to an aspect of the present invention is a method for manufacturing a semiconductor apparatus provided with a semiconductor element, a control terminal electrically connected to a top electrode of the semiconductor element through a wiring member, and a case member which is monolithically molded with the control terminal and which defines a space for housing the semiconductor element, in which the control terminal includes a pad that acts as a connection point of the wiring member, and the case member includes a raised positioning part that acts as a reference point for positioning the wiring member with respect to the pad, the method comprising: connecting the wiring member to the pad, wherein a planar image of the area around the pad is captured and the wiring member is connected to the pad on a basis of relative coordinates between the positioning part and the pad in the planar image.

According to the present invention, the positional precision of wire bonding can be improved.

BRIEF DESCRIPTION OF THE DRAWINGS

FIG. 4 is a cross section taken along the line A-A in FIG. 1;

DETAILED DESCRIPTION OF THE PREFERRED EMBODIMENT

Figure 1:
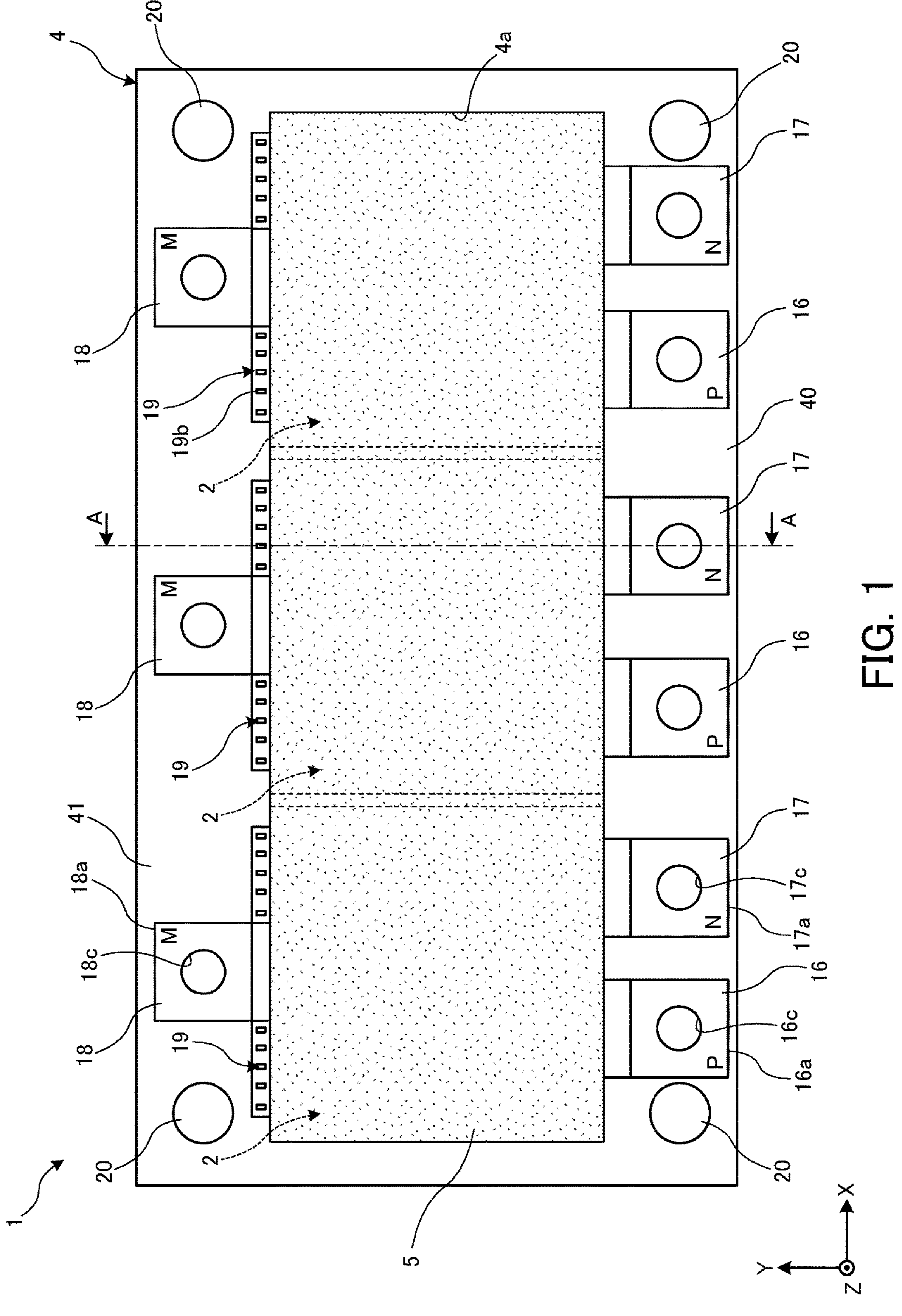
FIG. 1 is a plan view of a semiconductor apparatus according to an embodiment.
Figure 2:
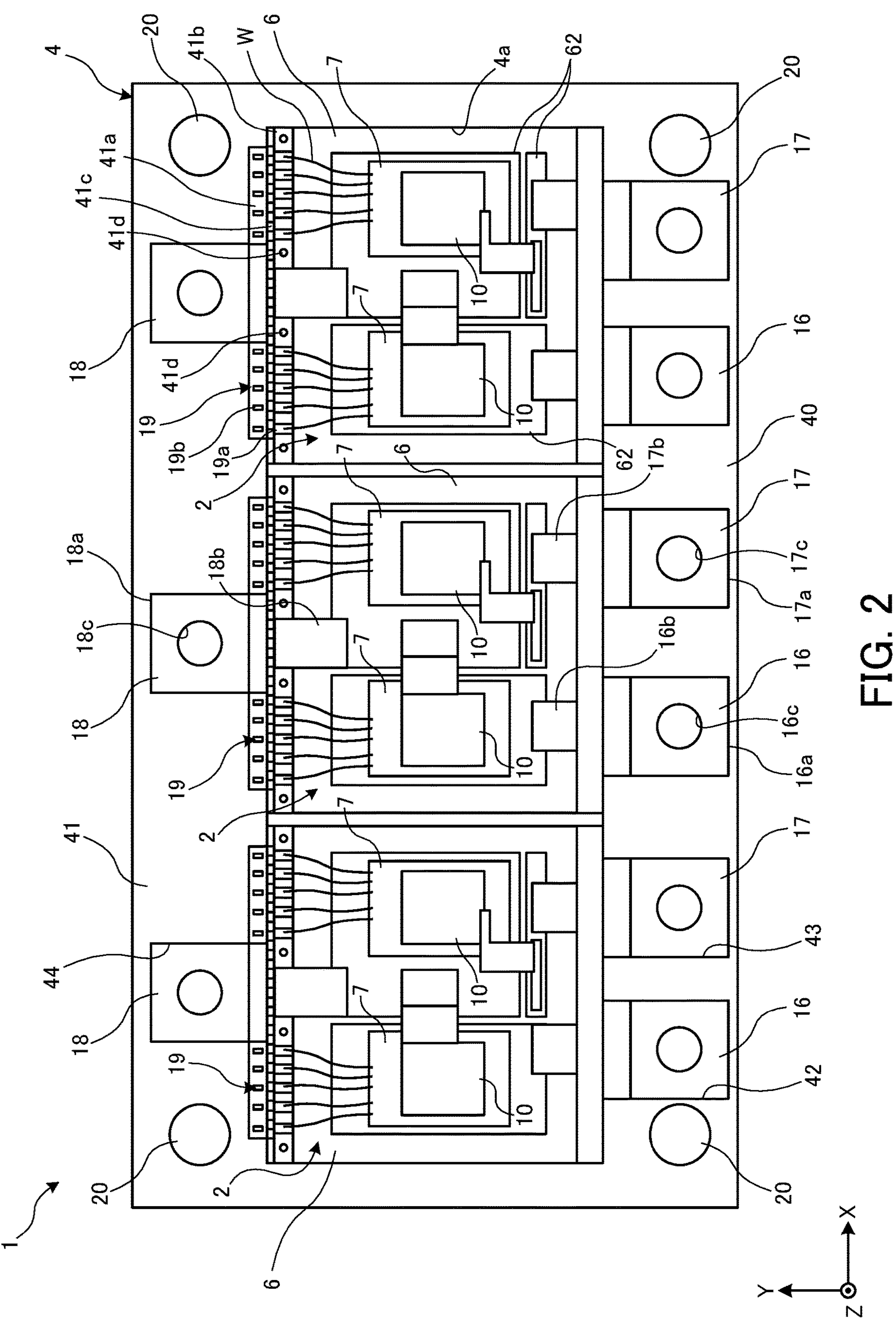
FIG. 2 is a plan view in which the encapsulating resin in FIG. 1 has been omitted.
Figure 3:
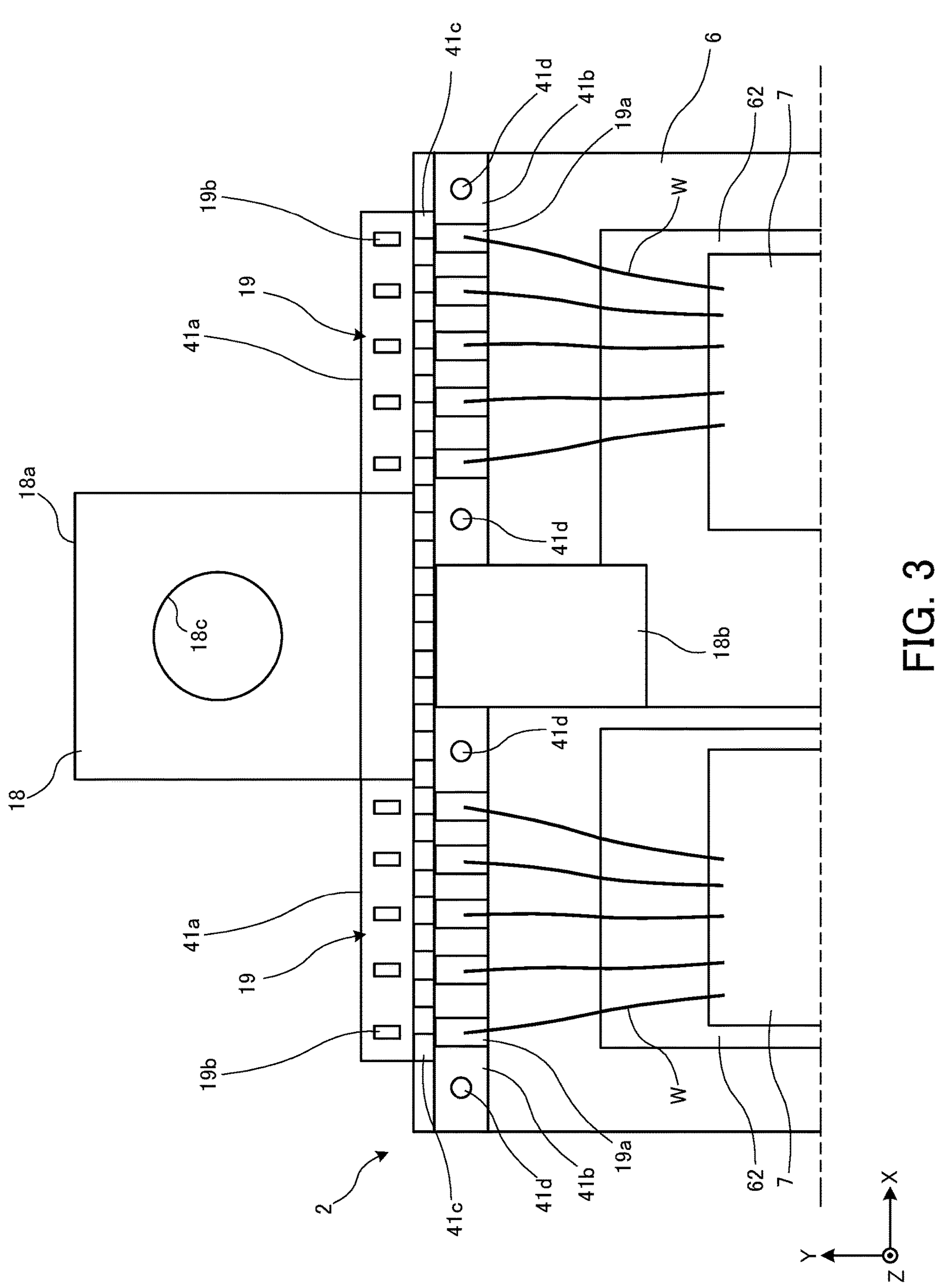
FIG. 3 is an enlarged view of a portion of FIG. 2.
Figure 5:
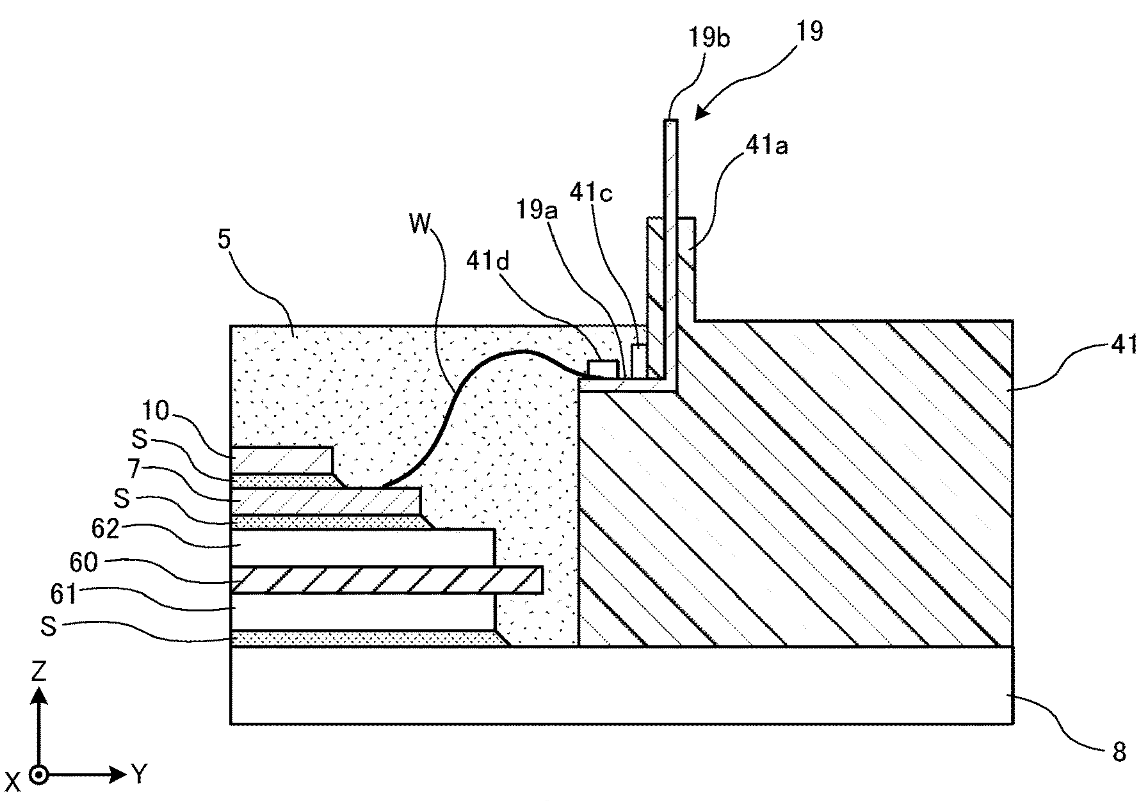
FIG. 5 is an enlarged view of a portion of FIG. 4.
Figure 6:
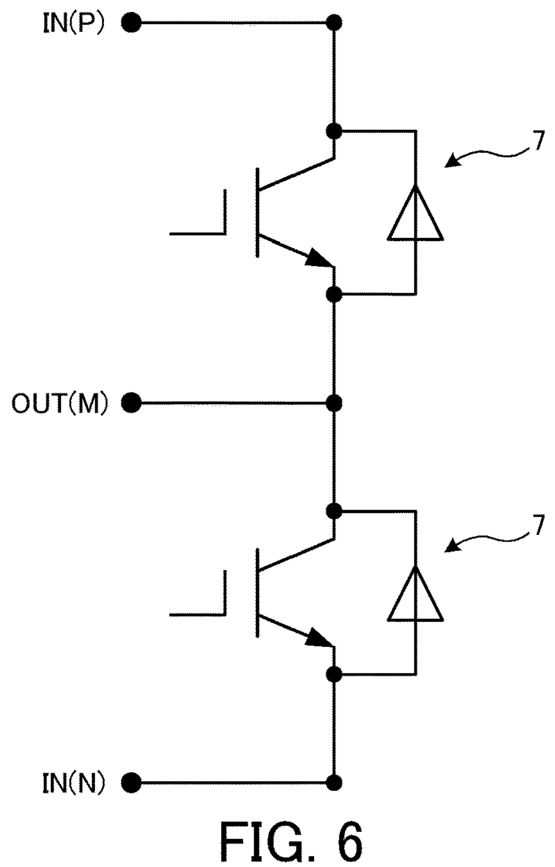
FIG. 6 is a schematic plan view illustrating an example of a circuit configuration of the semiconductor apparatus according to the present embodiment.

Hereinafter, a semiconductor apparatus to which the present invention can be applied will be described. FIG. 1 is a plan view of a semiconductor apparatus according to the present embodiment. FIG. 2 is a plan view in which the encapsulating resin in FIG. 1 has been omitted. FIG. 3 is an enlarged view of a portion of FIG. 2. FIG. 4 is a cross section taken along the line A-A in FIG. 1. FIG. 5 is an enlarged view of a portion of FIG. 4. FIG. 6 is a schematic plan view illustrating an example of a circuit configuration of the semiconductor apparatus according to the present embodiment. Note that the semiconductor apparatus illustrated below is merely one non-limiting example, and may be modified appropriately.

Also, in the following diagrams, the longitudinal direction of the semiconductor apparatus (cooler) is designated the X direction, the lateral direction of the semiconductor module (cooler) is designated the Y direction, and the height direction (substrate thickness direction) is designated the Z direction. Moreover, the longitudinal direction of the semiconductor apparatus refers to the direction in which a plurality of semiconductor modules (unit modules) are arranged. The illustrated X, Y, and Z axes are orthogonal to each other and constitute a right-handed coordinate system. Additionally, in some cases, the X direction may be referred to as the left-right direction, the Y direction as the front-back direction, and the Z direction as the up-down direction. These directions (front-back, left-right, and up-down directions) are terms used for convenience in the description, and depending on the installed attitude of the semiconductor apparatus, the correspondence relationships between these directions and the XYZ directions may change. For example, the surface on the heat-dissipating side (cooler side) of the semiconductor apparatus is referred to as the bottom surface, while the opposite side is referred to as the top surface. Also, in this specification, a plan view means the case of viewing the top or bottom face of the semiconductor apparatus from the Z direction.

A semiconductor apparatus 1 according to the present embodiment is applied to a power conversion apparatus such as a power control module, for example, and is a power semiconductor module that forms an inverter circuit. As illustrated in FIGS. 1 to 5, the semiconductor apparatus 1 includes a plurality (in the present embodiment, three) unit modules 2, a cooler 3 that cools the unit modules 2, a case member 4 that houses the plurality of unit modules 2, and an encapsulating resin 5 injected into the case member 4.

Each unit module 2 includes an insulating substrate 6 and semiconductor elements 7 disposed on top of the insulating substrate 6. In the present embodiment, three unit modules 2 are arranged in the X direction. The three unit modules 2 constitute a U phase, a V phase, and a W phase from the positive X side, for example, and form a three-phase inverter circuit overall. Note that the unit modules 2 may also be referred to as power cells or semiconductor units.

The cooler 3 is provided with a base plate 8 formed into a rectangular shape in a plan view. The base plate 8 has a rectangular shape in a plan view, and is formed from a tabular body of predetermined thickness. The longitudinal direction of the base plate 8 extends in the left-right direction (X direction) of the semiconductor apparatus 1, and the lateral direction extends in the front-back direction (Y direction) of the semiconductor apparatus 1. The base plate 8 has a face (bottom face) and another face (top face). The face forms the heat-dissipating surface of the unit modules 2. The other face forms the bonding surface of the unit modules 2.

The base plate 8 is formed from an alloy of aluminum or copper, for example, with favorable heat dissipation. In addition, a plating layer of predetermined thickness is formed on the surface of the base plate 8. The plating layer preferably is formed from a metal plating such as nickel. The insulating substrate 6 is disposed on the top face of the base plate 8 through a bonding material S such as solder. Also, a plurality of fins may be provided on the bottom face of the base plate 8.

The insulating substrate 6 is a direct copper bonding (DCB) substrate, an active metal brazing (AMB) substrate, or a metal base substrate, for example. Specifically, the insulating substrate 6 includes an insulating plate 60, a heat sink 61 disposed on the bottom face of the insulating plate 60, and a plurality of circuit boards 62 disposed on the top face of the insulating plate 60. The insulating substrate 6 is formed into a rectangular shape in a plan view, for example.

The insulating plate is formed from a ceramic material such as alumina ($Al_2O_3$), aluminum nitride (AlN), or silicon nitride ($Si_3N_4$), a resin material such as epoxy, or an insulating material such as an epoxy resin using a ceramic material as a filler, for example. Note that the insulating plate may also be referred to as an insulating layer or an insulating film.

The heat sink has a predetermined thickness in the Z direction, and is formed so as to cover the bottom face of the insulating plate. The heat sink is formed from a metal plate with favorable thermal conductivity, such as copper or aluminum, for example.

The plurality of circuit boards 62 are formed on the top face of the insulating plate. In FIG. 2, for convenience, three circuit boards 62 are formed on a single insulating substrate 6, but one or more circuit boards 62 may be formed on the top face of an insulating plate. These circuit boards are metal layers of copper foil or the like, and are formed onto the insulating plate as islands that are electrically insulated from each other. Note that the circuit boards 62 may also be referred to as circuit layers.

The semiconductor elements 7 are disposed on the top face of the insulating substrate 6 (circuit boards 62) through the bonding material S such as solder. In FIG. 1, for convenience, two semiconductor elements 7 are illustrated on a single insulating substrate 6, but a greater number of semiconductor elements 7 may also be disposed on the insulating substrate 6. The semiconductor elements 7 are formed having a square or rectangular shape in a plan view from a semiconductor substrate such as silicon (Si), silicon carbide (SiC), gallium nitride (GaN), or diamond, for example.

Note that a switching element such as an insulated gate bipolar transistor (IGBT) or a power metal oxide semiconductor field effect transistor (power MOSFET), or a diode such as a free wheeling diode (FWD), is used as each of the semiconductor elements 7. A switching element and a diode may also be connected in inverse-parallel. Also, an element such as a reverse-conducting IGBT (RC-IGBT) element that combines an IGBT and an FWD in one, a power MOSFET element, or a reverse-blocking IGBT (RB-IGBT) having a sufficient withstand voltage with respect to a reverse bias may also be used as each of the semiconductor elements 7.

Also, properties such as the shape, number, and placement of the semiconductor elements 7 may be changed appropriately. Note that the semiconductor elements 7 according to the present embodiment are vertical switching elements in which a functional element such as a transistor is formed on a semiconductor substrate, but the semiconductor elements 7 are not limited thereto and may also be horizontal switching elements.

Top electrodes of the semiconductor elements 7 are conductively connected to a predetermined circuit board 62 through metal wiring plates 10. The metal wiring plates 10 are formed by a bending process such as press working using a metal material such as a copper material, a copper alloy material, an aluminum alloy material, or an iron alloy material, for example. For example, the semiconductor elements 7 and one end of the metal wiring plates 10 are bonded by the bonding material S such as solder. Also, the predetermined circuit board 62 and the other end of the metal wiring plates 10 are bonded by the bonding material S such as solder. The metal wiring plates 10 may also be referred to as lead frames.

In addition, an inverter circuit as illustrated in FIG. 6 may be formed by the metal wiring plates 10, the circuit boards 62, and the semiconductor elements 7 described above. In this case, an example is illustrated in which P, N, and M denote the positive, negative, and intermediate terminals, respectively, and two semiconductor elements 7 are connected in series.

The case member 4 is disposed on the top periphery of the base plate 8. The case member 4 is bonded to the base plate 8 through an adhesive, for example. The case member 4 has a shape that follows the outline of the base plate 8. More specifically, the case member 4 is formed into a rectangular frame shape having an opening 4*a* in the center. Three of the unit modules 2 described above are housed in the rectangular opening 4*a*. In other words, three unit modules 2 are housed in the space defined by the frame-shaped case member 4.

The case member 4 is provided with main terminals (P terminals 16, N terminals 17, M terminals 18) for external connection and control terminals 19 for control. Of the pair of walls 40, 41 facing each other in the lateral direction (Y direction) of the case member 4, recesses 42, 43 having a quadrilateral shape in a plan view are formed in the wall 40 positioned on the negative Y side.

The P terminals 16 (nuts 16*a* described later) are disposed in the recesses 42. One P terminal 16 is disposed with respect to one unit module 2. The P terminal 16 is connected to the insulating substrate 6 (predetermined circuit board) through the bonding material S such as solder.

The P terminal 16 is formed by monolithically molding a nut 16*a* and a tabular part 16*b*. The nut 16*a* is formed into a quadrilateral nut of predetermined thickness. A screw hole 16*c* penetrating in the thickness direction is formed in the center of the nut 16*a*. The nut 16*a* is provided on one end (a base end) of the tabular part 16*b*.

The tabular part 16*b* has a planar shape with a top face and a bottom face. The tabular part 16*b* has an elongated shape that is long in the Y direction in a plan view. Additionally, the other end (leading end) of the tabular part 16*b* is bonded to the circuit layer of the insulating substrate 6 through the bonding material S.

Similarly, the N terminals 17 (nuts 17*a* described later) are disposed in the recesses 43. One N terminal 17 is disposed with respect to one unit module 2. The N terminal 17 is connected to the insulating substrate 6 (predetermined circuit board) through the bonding material S such as solder.

The N terminal 17 is formed by monolithically molding a nut 17*a* and a tabular part 17*b*. The nut 17*a* is formed into a quadrilateral nut of predetermined thickness. A screw hole 17*c* penetrating in the thickness direction is formed in the center of the nut 17*a*. The nut 17*a* is provided on one end (a base end) of the tabular part 17*b*.

The tabular part 17*b* has a planar shape with a top face and a bottom face. The tabular part 17*b* has an elongated shape that is long in the Y direction in a plan view. Additionally, the other end (leading end) of the tabular part 17*b* is bonded to the circuit layer of the insulating substrate 6 through the bonding material S.

Also, of the pair of walls 40, 41 facing each other in the lateral direction (Y direction) of the case member 4, recesses 44 having a quadrilateral shape in a plan view are formed in the wall 41 on the positive Y side. The M terminals 18 (nuts 18*a* described later) are disposed in the recesses 44. One M terminal 18 is disposed with respect to one unit module 2. The end (tabular part 18*b*) of the M terminal 18 is connected to the insulating substrate 6 (predetermined circuit board) through the bonding material S such as solder.

The M terminal 18 is formed by monolithically molding a nut 18*a* and a tabular part 18*b*. The nut 18*a* is formed into a quadrilateral nut of predetermined thickness. A screw hole 18*c* penetrating in the thickness direction is formed in the center of the nut 18*a*. The nut 18*a* is provided on one end (a base end) of the tabular part 18*b*.

The tabular part 18*b* has a planar shape with a top face and a bottom face. The tabular part 18*b* has an elongated shape that is long in the Y direction in a plan view. Additionally, the other end (leading end) of the tabular part 18*b* is bonded to the circuit layer of the insulating substrate 6 through the bonding material S.

The P terminals 16 described above may also be referred to as positive terminals (input terminals), the N terminals 17 may also be referred to as negative terminals (output terminals), and the M terminals 18 may also be referred to as intermediate terminals (output terminals). These terminals form a metal wiring plate through which a main current flows. One ends of the P terminals 16, N terminals 17, and M terminals 18 form main terminals connectible to an external conductor, and one ends of the P terminals 16, N terminals 17, and M terminals 18 are bonded to a predetermined circuit layer of the insulating substrate 6 through the bonding material S. Additionally, the P terminals 16, N terminals 17, and M terminals 18 correspond to P, N, and M in FIG. 6.

These terminals are formed from a metal material such as a copper material, a copper alloy material, an aluminum alloy material, or an iron alloy material. Note that properties such as the shape, placement, number, and the like of these terminals are not limited to the above description and may be changed appropriately.

Also, the control terminals 19 are provided on the wall 41 on the positive Y side. Ten control terminals 19, for example, are disposed with respect to one unit module 2. More specifically, in a single unit module 2, ten control terminals 19 are disposed with five each on either side of the M terminal 18 in the left-right direction (X direction). The ten control terminals are disposed along the periphery of the opening 4*a*. Note that the number of disposed control terminals 19 is not limited to the above and may be changed appropriately.

On the edge of the wall 41, a pair of pillars 41*a* projecting vertically in the Z direction from the top face of the wall 41 is formed along the opening 4*a*. The pair of pillars 41*a* is disposed with the M terminal 18 in between. Also, on the inner side (negative Y side) of the pillars 41*a*, a step 41*b* that is one step down from the top face of the wall 41 is formed along the opening 4*a*. The step 41*b* is also disposed in a pair for each unit module 2 with the M terminal 18 in between in the left-right direction (X direction).

The control terminals 19 are formed from a metal material such as a copper material, a copper alloy material, an aluminum alloy material, or an iron alloy material, for example. The control terminals 19 are formed by monolithic molding (insert molding) so as to be embedded in the case member 4.

More specifically, five control terminals 19 are embedded into one of the pillars 41*a* and the corresponding step 41*b*. The control terminals 19 are approximately L-shaped in a cross section taken in the YZ plane. Additionally, the control terminals 19 include inner terminal parts 19*a* (one end parts) connected to the semiconductor elements 7 on the inner side and outer terminal parts 19*b* (other end parts) for external connection. The control terminals 19 are formed into an L-shape in a side view by the joining of the inner terminal parts 19*a* and the outer terminal parts 19*b*.

The inner terminal parts 19*a* on one end of the control terminals 19 have a planar shape that follows the planar direction of the semiconductor elements 7. Also, the inner terminal parts 19*a* extend inwardly in the Y direction from the inner face of the case member 4 (opening 4*a*). The inner terminal parts 19*a* have a predetermined thickness in the Z direction.

Also, the majority of the inner terminal parts 19*a*, excluding the top face, is embedded in the step 41*b*. The top faces of the inner terminal parts 19*a* are flush with the top face of the step 41*b*. In other words, the top faces of the inner terminal parts 19*a* are exposed on the step 41*b*. Although described in detail later, the top faces of the inner terminal parts 19*a* are connection locations (bonding points) for wiring members W (bonding wires). The inner terminal parts 19*a* may also be referred to as bonding pads 19*a*. The inner terminal parts 19*a* are connected to the top electrodes of the semiconductor elements 7 through the wiring members W (which may also be referred to as control wiring).

Figure 8:
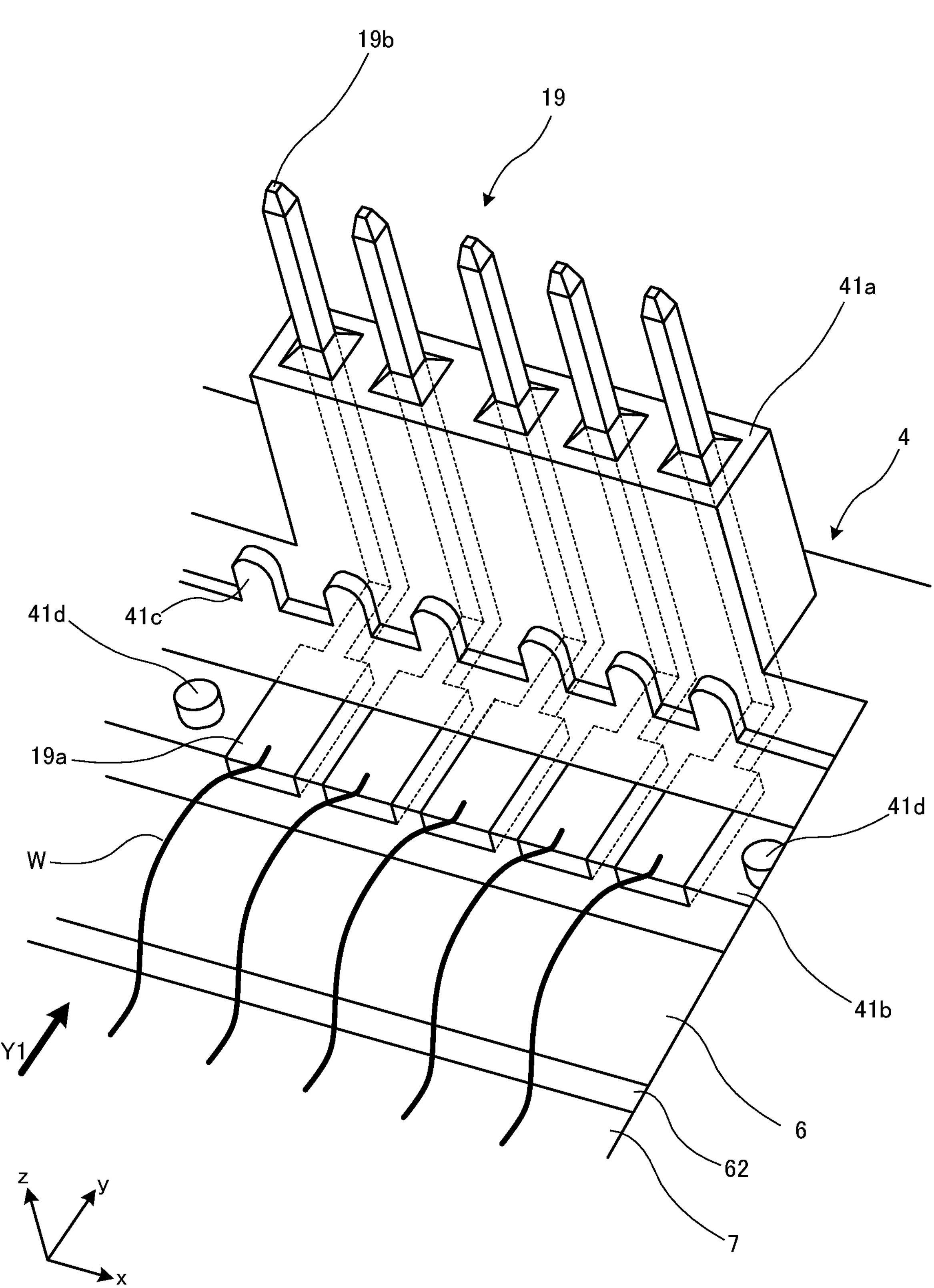
FIG. 8 is a perspective view of the area around control terminals of the semiconductor apparatus according to the present embodiment.

The outer terminal parts 19*b* on the other end of the control terminals 19 extends in a perpendicular direction and are joined to the inner terminal parts 19*a* inside the pillar 41*a* (see FIG. 8). The intermediate parts (base end parts) of the outer terminal parts 19*b* standing upright are embedded in the pillar 41*a*. On the other hand, the upper ends which are the leading ends of the outer terminal parts 19*b* project out a predetermined length from the top face of the pillar 41*a*. Note that the cross section of the outer terminal parts 19*b* may be polygonal or circular. Moreover, the outer terminal parts 19*b* may be formed from press-fit pins.

In addition, on the inner face of the opening 4*a* between the pillar 41*a* and the step 41*b*, a plurality of raised parts 41*c* for increasing the adhesion of the encapsulating resin 5 are formed. Also, raised positioning parts 41*d* that act as landmarks during bonding are formed on the top face of the step 41*b*. These parts will be described later.

In addition, a plurality of through-holes 20 are formed along the outer periphery of the case member 4. The through-holes 20 are holes for inserting screws (not illustrated) for securing the semiconductor apparatus 1. The through-holes 20 penetrate to the base plate 8 of the cooler 3.

Note that besides PPS, the resin for the case member 4 may be selected from among insulating resins such as polybutylene terephthalate (PBT), poly(butyl acrylate) (PBA), polyamide (PA), acrylonitrile butadiene styrene (ABS), liquid crystal polymer (LCP), polyether ether ketone (PEEK), polybutylene succinate (PBS), urethane, and silicone. Moreover, the selected resin may also be a mixture of two or more types of resin. The resin may also contain a filler (glass filler, for example) for improving strength and/or functionality.

Conductor wires (bonding wires) are used as the wiring members W. Gold, copper, aluminum, gold alloy, copper alloy, and aluminum alloy can be used either singly or in combination with each other as the material of the conductor wires. Additionally, it is also possible to use members other than conductor wires as the wiring members. For example, ribbons can be used as the wiring members.

In addition, the internal space prescribed by the frame-shaped case member 4 is filled with the encapsulating resin 5. In other words, with this arrangement, the insulating substrates 6 and the semiconductor elements 7 mounted thereon are encapsulated inside the above-mentioned space. The case member 4 defines a space that houses the plurality of unit modules 2 (insulating substrates 6, semiconductor elements 7) and the encapsulating resin 5.

The encapsulating resin 5 is formed from a thermosetting resin. The encapsulating resin 5 preferably includes at least one of epoxy, silicone, urethane, polyimide, polyamide, and polyamide-imide. For example, an epoxy resin mixed with a filler is favorable as the encapsulating resin 5 from the standpoint of insulation, heat resistance, and heat dissipation.

By the way, in a semiconductor apparatus, electrical wiring between semiconductor elements and terminals is achieved by wire bonding. For example, an automatic wire bonding apparatus is used to connect bonding wires. This type of wire bonding apparatus ordinarily has a function for automatically correcting the wire bonding locations.

For example, in the related art, a camera of the wire bonding apparatus is used to detect a planar image of a chip and bonding pads, and the wire bonding apparatus is programmed to bond wires onto the bonding pads by using a predetermined location as a reference.

Figure 7A:
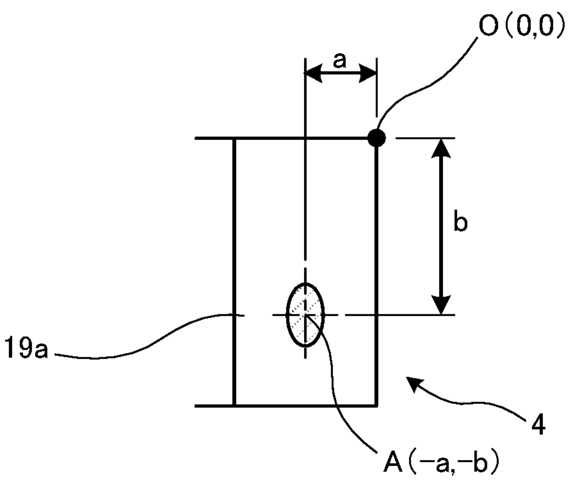
FIGS. 7A and 7B are schematic diagrams illustrating a wire bonding method according to a comparative example.
Figure 7A:
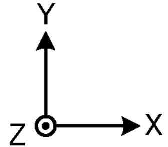
Figure 7B:
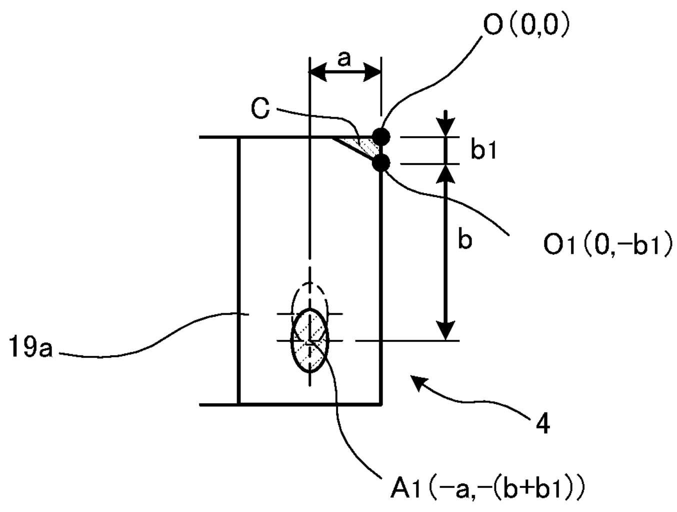
Figure 7B:
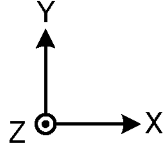

At this point, FIGS. 7A and 7B will be referenced to describe a wire bonding method of the related art. FIGS. 7A and 7B are schematic diagrams illustrating a wire bonding method according to a comparative example. FIGS. 7A and 7B are schematic plan views of the area around a bonding pad (inner terminal part). Note that in FIGS. 7A and 7B, portions of the configuration that have already been described are denoted with signs similar to the above and a description is omitted, as appropriate.

As illustrated in FIG. 7A, in the comparative example, a corner of a bonding pad 19*a* is set to a reference point O(0,0). Here, the values indicated in parentheses express the coordinates in the XY plane. In this case, the bonding location (connection point A) in the approximate center of the bonding pad 19*a* can be expressed by the coordinates A(−a,−b) with reference to the reference point O.

By the way, as described above, the control terminals 19 and the case are formed by monolithic molding (insert molding). Consequently, as illustrated in FIG. 7B, a burr C of resin may be formed at the corner of the bonding pad 19*a* which is the boundary between resin and metal. In this case, it is anticipated that the bonding apparatus will misrecognize the tip of the burr C as a reference point $O_1(0,-b_1)$ during image recognition. As a result, the actual bonding location is shifted to a connection point $A_1(-a,-(b+b_1))$, and wire bonding at the correct position cannot be achieved.

In this way, in the case of performing wire bonding on the bonding pad 19*a* of the control terminal 19 integrated with the case member 4, using a boundary portion between resin and metal as a reference point may affect the bonding precision, depending on the quality of the molded article.

The bonding precision also affects the bonding strength of the wire. Specifically, if the wire bonding is positioned incorrectly, the bonding strength of the wire is lowered. In this case, the wire separates from the bonding pad 19*a* more easily, and as a result, the product lifetime may be greatly affected in relation to the tolerance with respect to reliability testing such as thermal shock testing, heat cycle testing, and ΔTj power cycle testing.

Accordingly, the inventors focused on the relationship between the locations where burrs occur due to the monolithic molding of the case and terminals and the bonding reference position, and conceived of the present invention. The gist of the present invention is the provision of a reference position for bonding at a location different from the location where a burr occurs. Specifically, in the present embodiment, the raised positioning parts 41*d* that act as reference points for the positioning of the connection points of the wiring members W with respect to the bonding pads 19*a* are disposed near the bonding pads 19*a*.

FIG. 8 is a perspective view of the area around control terminals of the semiconductor apparatus according to the present embodiment. As illustrated in FIG. 8, two positioning parts 41*d* are disposed with respect to one unit module 2. These two positioning parts 41*d* are disposed on the top face of the step 41*b*, on the left and right sides of five bonding pads 19*a* arranged in a row. The positioning parts 41*d* have a cylindrical shape projecting upward, for example.

Figure 9A:
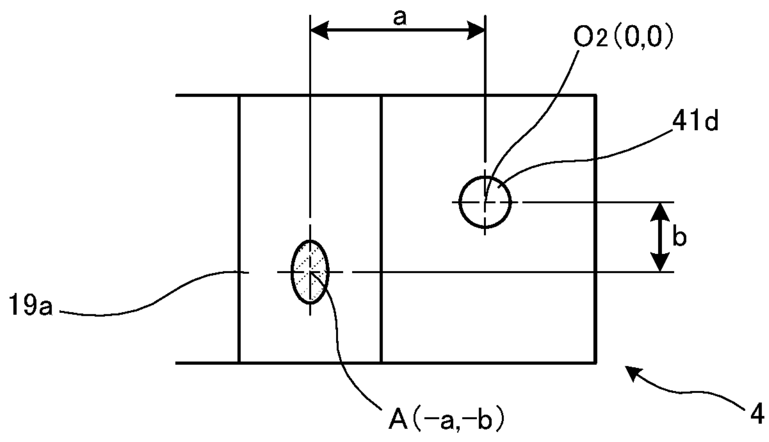
FIGS. 9A and 9B are schematic diagrams illustrating a wire bonding method according to the present embodiment.
Figure 9A:
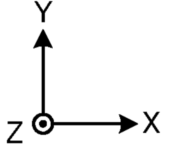
Figure 9B:
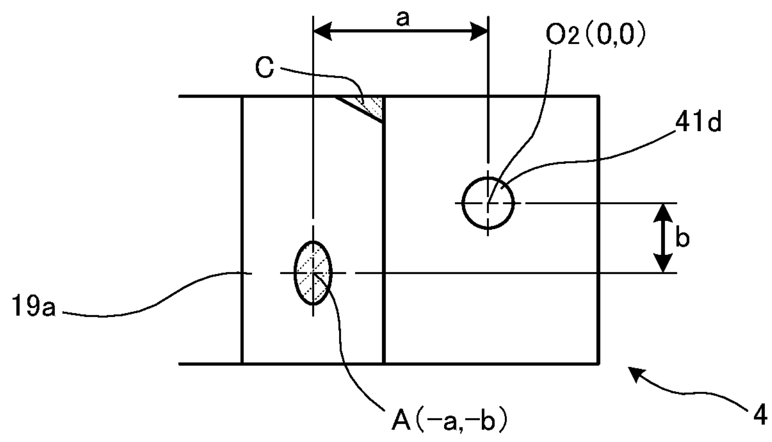
Figure 9B:
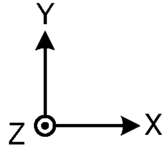

At this point, a wire bonding method according to the present embodiment will be described. FIGS. 9A and 9B are schematic diagrams illustrating a wire bonding method according to the present embodiment. In FIGS. 9A and 9B, for convenience, only a single bonding pad 19*a* is illustrated. Note that in the present embodiment, the insulating substrates 6 and the semiconductor elements 7 are mounted onto the top face of the base plate 8 in advance before the bonding step is performed, and the case member 4 including the monolithically molded control terminals 19 is disposed around the mounted components (for example, the state in FIG. 2 with the wiring members W omitted).

In the case of performing wire bonding on each bonding pad 19*a*, in the bonding apparatus, a planar image of the area around the bonding pad 19*a* is captured. As illustrated in FIG. 9A, for example, in the bonding apparatus, the relative coordinates of a target point (connection point A) for each bonding location is predetermined by treating a positioning part 41*d* as a reference (reference point $O_2$). If the reference point $O_2(0,0)$ is set as the origin, the coordinates of the target bonding location is expressed as the connection point A(−a,−b).

As illustrated in FIG. 9B, even if a burr C occurs in the corner of the bonding pad 19*a*, the positioning part 41*d* treated as the reference point $O_2$ is disposed at a position beside the bonding pad 19*a*, different from the location where the burr C occurs. For this reason, the bonding apparatus is capable of clearly distinguishing between the burr C and the reference point $O_2$ in the captured image. Consequently, the bonding apparatus can scan the target point (connection point A) with the tip of a bonding tool on the basis of the preset relative coordinates, without being influenced by the burr C. As a result, it is possible to improve the precision of the bonding location.

In this way, in the present embodiment, a location different from the location where the burr C occurs is treated as the reference point $O_2$ for bonding. For this reason, it is possible to improve the positional precision of the bonding location, regardless of the quality of the monolithically molded case member 4. Consequently, the bonding strength of the bonding wires can be improved, making it possible to suppress a reduction in tolerance with respect to reliability testing due to a wire break.

Moreover, it is possible to remedy defects that had occurred in the assembly step (bonding step) because the correct bonding location could not be detected due to a burr C, like in the comparative example. Furthermore, even if there is a burr C, the bonding precision is unaffected, and therefore a necessary burr removal step during the molding of the case member 4 is simplified. As a result, the number of steps can be reduced, and cost savings can be achieved.

Also, since the positioning parts 41*d* have an upwardly projecting pin shape, a worker is able to recognize (visually confirm) the positioning parts 41*d* easily. In this case, the surface of the positioning parts 41*d* and the surrounding case member 4 preferably have a glossy surface. The surface roughness Ra of the surface of the positioning parts 41*d* and the surrounding case member 4 may be from 0.1 μm to 5.0 μm, more preferably from 0.5 μm to 1.5 μm. With this arrangement, the bonding apparatus can distinguish light and dark portions of the image (for example, the positioning parts 41*d*, the bonding pad 19*a*, and the boundary with the surrounding case member 4) more easily when capturing a planar image, and the positional precision of bonding can be improved further.

Figure 10:
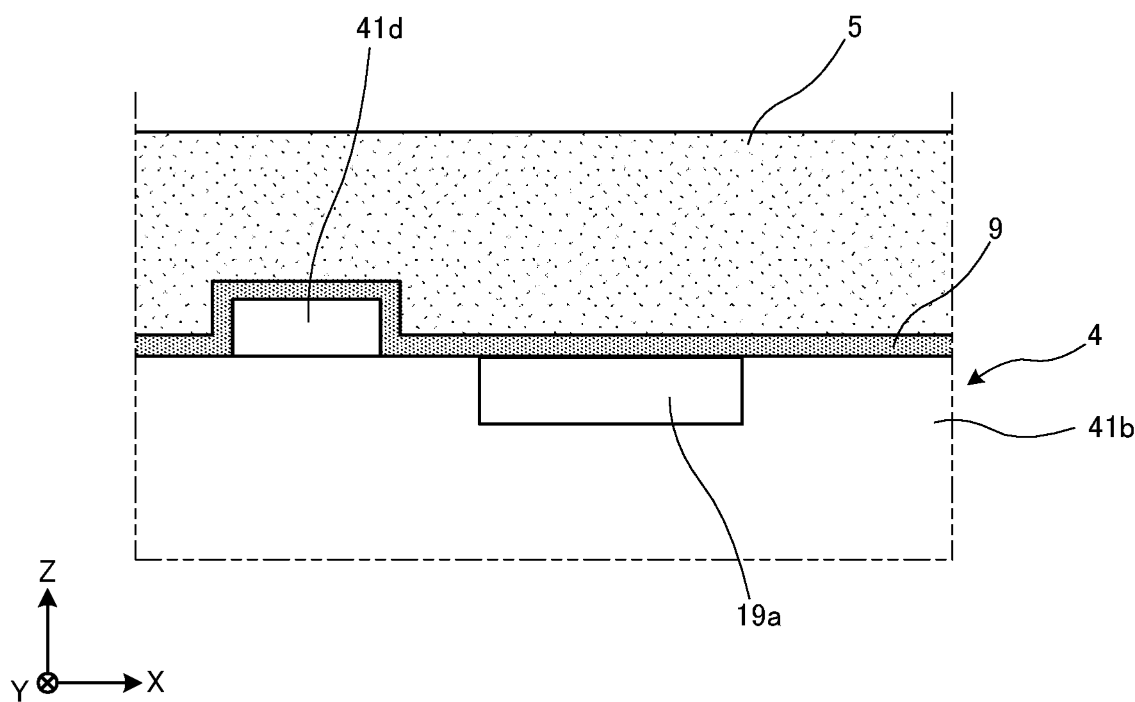
FIG. 10 is a schematic side view of the area around a control terminal of the semiconductor apparatus according to the present embodiment.

FIG. 10 is a schematic side view of the area around a control terminal of the semiconductor apparatus according to the present embodiment, and is a side view in the direction of the arrow Y1 in FIG. 8. As described above, in addition to the positioning parts 41*d* having an upwardly projecting pin shape, the encapsulating resin 5 fills the case member 4 so as to cover the positioning parts 41*d*. Due to the projecting positioning parts 41*d*, a large contact area between the case member 4 and the encapsulating resin 5 can be secured, thereby making it possible to improve the adhesion (anchor effect) between the case member 4 and the encapsulating resin 5.

Also, as illustrated in FIG. 10, when filling the case member 4 with the encapsulating resin 5, the top face of the case member 4 is preferably coated in advance with a coating film 9 of predetermined thickness. The coating film 9 is applied to the entire top face of the case member 4, and then filled over by the encapsulating resin 5. This results in a state in which the coating film 9 of predetermined thickness is interposed between the positioning parts 41*d* and the encapsulating resin 5.

In this case, the thickness of the coating film 9 may be from 0.1 μm to 20 μm, preferably from 1 μm to 10 μm. Also, the material of the coating film 9 may be a polyamide resin, a polyamide-imide resin, or a polyether amide resin. The material of the coating film 9 may also be silica. The coating film makes it possible to improve adhesion further.

Also, as illustrated in FIG. 8, the positioning parts 41*d* are disposed on the left and right sides of five bonding pads 19*a* arranged in a row. In other words, two positioning parts 41*d* are disposed with five bonding pads 19*a* in between in the left-right direction (X direction). In this case, by disposing the positioning parts 41*d* on the left and right sides of a plurality of bonding pads 19*a* arranged in a row, when forming the coating film 9, the coating film 9 stays uniformly on the plurality of bonding pads 19*a* and the surrounding case member 4 more easily, without becoming runny and spreading to unwanted portions. Consequently, the coating film 9 of predetermined film thickness can be formed easily, and the adhesion of the bonding pads 19*a* and the surrounding case member 4 with the encapsulating resin 5 can be improved further.

Also, as illustrated in FIG. 8, a plurality of raised parts 41*c* are formed on the inner face of the wall 41. The raised parts 41*c* project out from the inner face of the wall 41 by a predetermined thickness on the negative Y side. By arranging the plurality of raised parts 41*c*, an uneven shape is formed on the inner face of the wall 41. The uneven shape forms an anchor part for improving adhesion between the case member 4 and the encapsulating resin 5. In other words, by covering the plurality of raised parts 41*c* with the encapsulating resin 5, a large contact area between the case member 4 and the encapsulating resin 5 is secured, and an even greater anchor effect can be obtained. In particular, by disposing the plurality of raised parts 41*c* near the connection locations (bonding locations) between the bonding pads 19*a* and the wiring members W, the bonding strength of the wiring members W can be secured sufficiently.

Additionally, as illustrated in FIG. 8, fillets may also be formed in the upper corners of the raised parts 41*c*. By forming the fillets, abrasion of the metal mold can be reduced, making it possible to lower running costs.

As described above, according to the present embodiment, by providing a reference point for bonding at a location different from the location where a burr occurs on the case member 4 which is a monolithically molded article, the positional precision of wire bonding can be improved without being influenced by the burr.

Note that in the above embodiment, the number and placement of the semiconductor elements 7 are not limited to the above configuration and may be changed appropriately.

Also, in the above embodiment, the number and layout of the circuit boards are not limited to the above configuration and may be changed appropriately.

Also, the above embodiment takes a configuration in which the insulating substrates 6 and the semiconductor elements 7 are formed into a rectangular or square shape in a plan view, but the embodiment is not limited to this configuration. These components may also be formed into polygonal shapes other than the above.

Also, the above embodiment describes a case where three unit modules 2 are configured by arranging the unit modules in the X direction in the order of U phase, V phase, W phase, but the embodiment is not limited to this configuration. The number of arranged unit modules and the arrangement direction may be changed appropriately. Moreover, the case member 4 is formed by integrating the three phase portions for the U, V, and W phases, but is not limited thereto and may be changed appropriately. The case member 4 may also be provided in a divided manner for each unit module.

Figure 11:
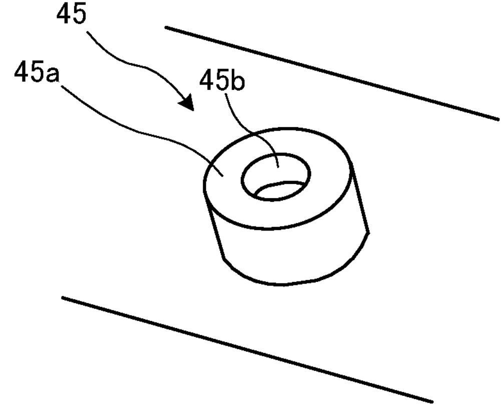
FIG. 11 is a schematic diagram illustrating a positioning part according to a modification.

Also, in the embodiment described above, the shape, number, placement, and arrangement pitch of the positioning parts 41*d* may be changed appropriately. For example, the positioning parts 41*d* are not limited to a cylindrical shape and may also have a polygonal or spherical shape. A positioning part 45 like the modification in FIG. 11 is also possible. In the positioning part 45 in FIG. 11, a circular recess 45*b* is formed in the top face (upper end) of an upwardly projecting cylindrical part 45*a*. By covering the entire positioning part 45 with the encapsulating resin 5, the contact area between the case member 4 and the encapsulating resin 5 can be increased further, and a greater anchor effect can be expected.

Also, in the above embodiment, two positioning parts 41*d* are disposed on the left and right sides of five bonding pads 19*a* arranged in a row. However, the arrangement is not limited to the above, and one positioning part 41*d* may also be disposed on one side of a single bonding pad 19*a*. Moreover, one positioning part 41*d* may be disposed on one side or two positioning parts 41*d* may be disposed on the left and right sides of a plurality of bonding pads 19*a* arranged in a row. Preferably, the positioning parts 41*d* are disposed on the left and right sides of three or more bonding pads 19*a* arranged in a row. With this arrangement, a compact semiconductor apparatus can be provided while also improving the positional precision of wire bonding.

Also, in the embodiment described above, the shape, number, placement, and arrangement pitch of the raised parts 41*c* forming the anchor part may be changed appropriately.

In addition, the present embodiment and modifications have been described, but the above embodiment and the modifications may also be combined in full or in part and treated as another embodiment.

Also, the present embodiment is not limited to the above embodiment and modifications, and various modifications, substitutions, and alterations are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiments are summarized below.

A semiconductor apparatus according to the above embodiment is provided with a semiconductor element, a control terminal electrically connected to a top electrode of the semiconductor element through a wiring member, and a case member which is monolithically molded with the control terminal and which defines a space for housing the semiconductor element, wherein the control terminal includes a pad that acts as a connection point of the wiring member, and the case member includes a raised positioning part that acts as a reference point for positioning the wiring member with respect to the pad.

Also, in the semiconductor apparatus according to the above embodiment, the case member is formed into a rectangular frame shape having an opening in the center, the control terminal is disposed along a wall of the rectangular frame-shaped case member, a step part that is a step down from a top face of the wall is formed in the wall, a portion of the control terminal is disposed flush with a top face of the step, and the top face forms the pad, and the positioning part is disposed beside the pad.

Also, in the semiconductor apparatus according to the above embodiment, the control terminal includes an outer terminal part for external connection and an inner terminal part connected to the top electrode of the semiconductor element through a wiring member, the top face of the inner terminal part forms the pad, an intermediate part of the outer terminal part is embedded in a pillar projecting upward from the top face of the wall, and a leading end of the outer terminal part projects out from a top face of the pillar.

Also, the semiconductor apparatus according to the above embodiment is further provided with an encapsulating resin filling the space, wherein a coating film of predetermined thickness is interposed between the positioning part and the encapsulating resin.

Also, the semiconductor apparatus according to the above embodiment is further provided with an encapsulating resin filling the space, wherein an anchor part having an uneven shape is formed on an inner face of the wall.

Also, in the semiconductor apparatus according to the above embodiment, the positioning part has a cylindrical shape.

Also, in the semiconductor apparatus according to the above embodiment, a recess is formed in an upper end of the positioning part.

Also, in the semiconductor apparatus according to the above embodiment, a plurality of pads are arranged in a predetermined direction, and two positioning parts are disposed with the plurality of pads in between in the predetermined direction.

Also, the semiconductor apparatus according to the above embodiment is further provided with a metal wiring plate, one end of which forms a main terminal connectible to an external conductor and another end of which is bonded, through a bonding material, to a circuit layer of an insulating substrate electrically connected to the semiconductor element, wherein the case member is formed into a rectangular frame shape having an opening in the center, and has a pair of walls facing each other in a predetermined direction, the metal wiring plate is formed by an intermediate terminal, a positive electrode terminal, and a negative electrode terminal, the positive electrode terminal and the negative electrode terminal are disposed on one wall of the pair of walls, the intermediate terminal is disposed on another wall of the pair of walls, and the control terminal is disposed on the other wall.

Also, a semiconductor apparatus manufacturing method according to the above embodiment is a method for manufacturing a semiconductor apparatus provided with a semiconductor element, a control terminal electrically connected to a top electrode of the semiconductor element through a wiring member, and a case member which is monolithically molded with the control terminal and which defines a space for housing the semiconductor element, in which the control terminal includes a pad that acts as a connection point of the wiring member, and the case member includes a raised positioning part that acts as a reference point for positioning the wiring member with respect to the pad, the method including connecting the wiring member to the pad, wherein a planar image of the area around the pad is captured and the wiring member is connected to the pad on a basis of relative coordinates between the positioning part and the pad in the planar image.

INDUSTRIAL APPLICABILITY

As described above, the present invention has an effect of making it possible to improve the positional precision of wire bonding, and is particularly useful in a semiconductor apparatus with an integrated cooler.

REFERENCE SIGNS LIST

- 1 semiconductor apparatus
- 2 unit module
- 3 cooler
- 4 case member
- 4*a* opening
- 5 encapsulating resin
- 6 insulating substrate
- 7 semiconductor element
- 8 base plate
- 9 coating film
- 10 metal wiring plate (lead frame)
- 16 P terminal
- 16*a* nut
- 16*b* tabular part
- 16*c* screw hole
- 17 N terminal
- 17*a* nut
- 17*b* tabular part
- 17*c* screw hole
- 18 M terminal
- 18*a* nut
- 18*b* tabular part
- 18*c* screw hole
- 19 control terminal
- 19*a* inner terminal part (bonding pad)
- 19*b* outer terminal part
- 20 through-hole
- 40 wall
- 41 wall
- 41*a* pillar
- 41*b* step
- 41*c* raised part
- 41*d* positioning part
- 42 recess
- 43 recess
- 44 recess
- 45 positioning part
- 45*a* cylindrical part
- 45*b* circular recess
- 60 insulating plate
- 61 heat sink
- 62 circuit board
- A connection point
- $A_1$ connection point
- C burr
- O reference point
- $O_1$ reference point
- $O_2$ reference point
- S bonding material
- W wiring member

What is claimed is:

1. A semiconductor apparatus, comprising:

a semiconductor element having a top electrode;

a control terminal including a pad electrically connected to the top electrode of the semiconductor element through a wiring member;

a case member in which at least a portion of the control terminal is embedded and which defines a space for housing the semiconductor element; and an encapsulating resin filling the space, wherein the case member includes a wiring member positioning part raised on the case member as a reference point for a positioning of the wiring member before a connection is made of the wiring member to the pad, and the semiconductor apparatus further comprises a coating film interposed between the positioning part and the encapsulating resin, the pad is provided in plurality as a pad group and the plurality of pads in the pad group is arranged in a predetermined direction, the positioning part is provided in plurality and two positioning parts among the plurality of positioning parts sandwich therebetween the pad group in the predetermined direction, one of the two positioning parts is disposed beside an outmost one of the plurality of pads at one of opposite ends of the pad group in the predetermined direction, and the other of the two positioning parts is disposed beside another outmost one of the plurality of pads at the other of the opposite ends of the pad group.

2. The semiconductor apparatus according to claim 1, wherein the case member has a rectangular frame shape with the space in a center of the case member in a plan view of the semiconductor apparatus, the case member including a wall, the control terminal is disposed in the wall, the wall includes a step part that is a step down from a top face of the wall, the control terminal has a top face and is embedded in the step part such that a portion of the top face of the control terminal is flush with the step part, and the positioning part is disposed at the top face of the wall, beside the pad.

3. The semiconductor apparatus according to claim 2, wherein the control terminal includes an outer terminal part for external connection and an inner terminal part connected to the top electrode of the semiconductor element through the wiring member, the top face of the control terminal that is flush with the step part is a top face of the inner terminal part, the wall has a pillar projecting upward from the top face of the wall, and the outer terminal part includes an intermediate part that is embedded in the pillar and a leading end that projects out from a top face of the pillar.

4. The semiconductor apparatus according to claim 2, further comprising:

an encapsulating resin filling the space, wherein the wall includes an anchor part on an inner face of the wall, the anchor part having an uneven shape.

5. The semiconductor apparatus according to claim 1, wherein the positioning part has a cylindrical shape.

6. The semiconductor apparatus according to claim 1, wherein the positioning part has a recess at an upper end thereof.

7. The semiconductor apparatus according to claim 1, further comprising:

an insulating substrate including a circuit layer electrically connected to the semiconductor element; and a metal wiring plate, one end of which forms a main terminal connectible to an external conductor and another end of which is bonded, through a bonding material, to the circuit layer of the insulating substrate, wherein the case member has a rectangular frame shape with the space in a center of the case member in a plan view of the semiconductor apparatus, and has first and second walls facing each other in a predetermined direction, the metal wiring plate includes an intermediate terminal, a positive electrode terminal, and a negative electrode terminal, the positive electrode terminal and the negative electrode terminal are disposed on the first wall, the intermediate terminal is disposed on the second wall, and the control terminal is disposed on the second wall.

8. A method of manufacturing the semiconductor apparatus of claim 1, comprising:

before the connection is made between the wiring member and the pad of the control terminal, producing a planar image of the area around the pad; and connecting the wiring member to the pad on a basis of relative coordinates between the positioning part and the pad in the planar image.

9. A method of manufacturing a semiconductor apparatus, comprising:

preparing a semiconductor product that includes a semiconductor element with a top electrode, a control terminal, including a pad that is to be electrically connected to the top electrode of the semiconductor element through a wiring member, and a case member in which at least a portion of the control terminal is embedded and which defines a space for housing the semiconductor element, the case member including a wiring member positioning part raised on the case member as a reference point for positioning of the wiring member to be connected to the pad, an encapsulating resin filling the space, and a coating film interposed between the positioning part and the encapsulating resin, wherein the pad is provided in plurality as a pad group and the plurality of pads in the pad group is arranged in a predetermined direction, the positioning part is provided in plurality and two positioning parts among the plurality of positioning parts sandwich therebetween the pad group in the predetermined direction, one of the two positioning parts is disposed beside an outmost one of the plurality of pads at one of opposite ends of the pad group in the predetermined direction, and the other of the two positioning parts is disposed beside another outmost one of the plurality of pads at the other of the opposite ends of the pad group;

producing a planar image of the area around the pad; and connecting the wiring member to one of the plurality of pads on a basis of relative coordinates between one of the plurality of positioning parts and the one of the plurality of pads in the planar image.

10. The semiconductor apparatus according to claim 2, wherein the coating film covers the step part of the case member.

11. The semiconductor apparatus according to claim 1, wherein the two positioning parts are respectively disposed on left and right sides of three or more pads of the plurality of pads arranged in a row.

12. The semiconductor apparatus according to claim 1, wherein each positioning part has an upwardly projecting pin shape.

13. The semiconductor apparatus according to claim 1, wherein a surface roughness of each of a surface of each positioning part and a surface of an area of the case member in which said each positioning part is disposed is in a range from 0.1 μm to 5.0 μm.

* * * * *